Figure 1:
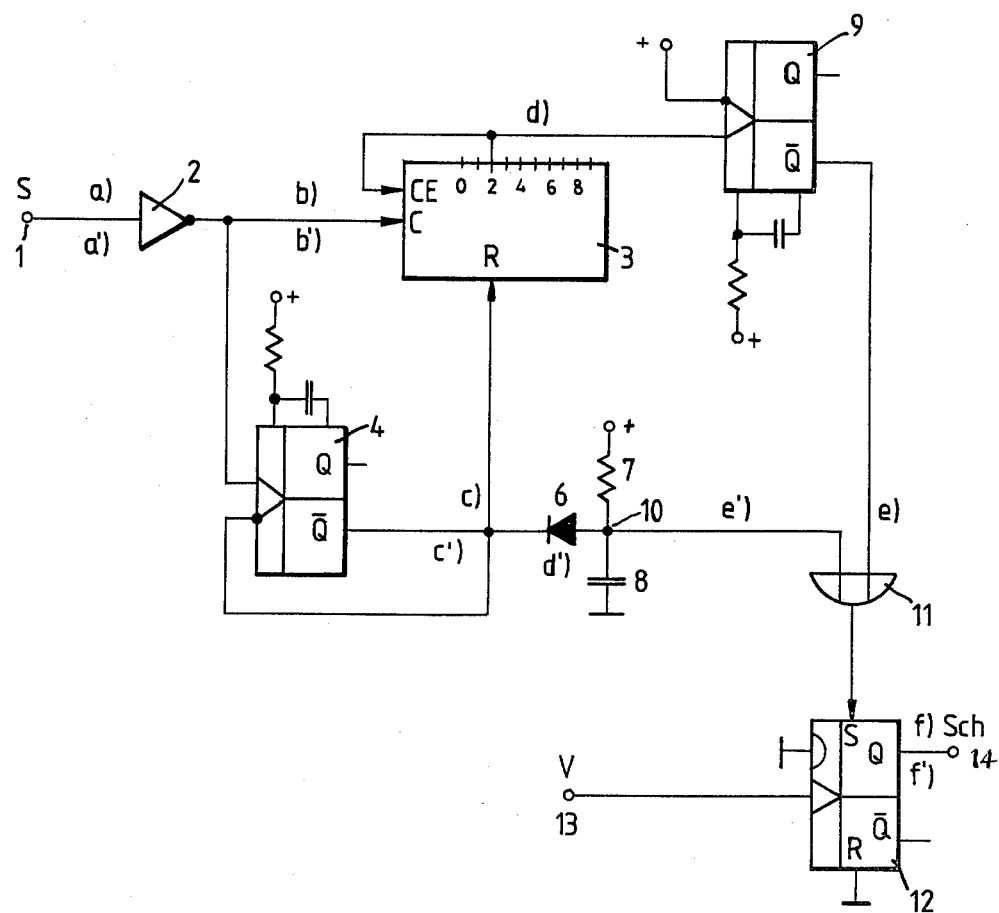

United States Patent [19]

Hoppe

[11] 4,353,091
[45] Oct. 5, 1982

[54] CIRCUIT FOR DETECTING FAULTS IN HORIZONTAL SYNC PULSE SIGNALS

[75] Inventor: Karl-Heinz Hoppe, Darmstadt-Wixhausen, Fed. Rep. of Germany

[73] Assignee: Robert Bosch GmbH, Stuttgart, Fed. Rep. of Germany

[21] Appl. No.: 216,862

[22] Filed: Dec. 16, 1980

[30] Foreign Application Priority Data

Dec. 19, 1979 [DE] Fed. Rep. of Germany ....... 2951023

[51] Int. Cl.³ .................... H04N 7/02; H04N 7/04; H04N 5/04; H03K 5/18
[52] U.S. Cl. .................................. 358/139; 358/147; 358/148; 358/153; 328/120; 328/138; 307/234; 307/522
[58] Field of Search .............. 358/148, 147, 153, 158, 358/139, 155; 328/108, 111, 112, 120, 138–140; 324/78 D, 78 R; 307/234, 522

[56] References Cited

U.S. PATENT DOCUMENTS

| | | | |
|---|---|---|---|
| 3,138,759 | 6/1964 | Thompson | 328/140 |
| 3,149,243 | 9/1964 | Garfield | 328/140 |
| 3,634,869 | 1/1972 | Hsueh | 307/234 |
| 3,903,474 | 9/1975 | Wiley | 328/120 |

*Primary Examiner*—John C. Martin
*Attorney, Agent, or Firm*—Frishauf, Holtz, Goodman & Woodward

[57] ABSTRACT

To obtain a switching signal whenever a fault occurs in the synchronization signals of a video signal, a fault detection circuit has a counter which receives the signals to be tested at its clock input and reference signals at its control input. The reference signals have the same pulse frequency as the signals to be tested and are obtained from the signals to be tested by a change in keying ratio. The output of the counter is connected in its "clear" input and also, via a monostable flip-flop, to an input from an OR-gate. The other input of the OR-gate receives the reference signals via a diode and an RC-link. The desired switching signal is obtained at the output of the OR-gate.

6 Claims, 3 Drawing Figures

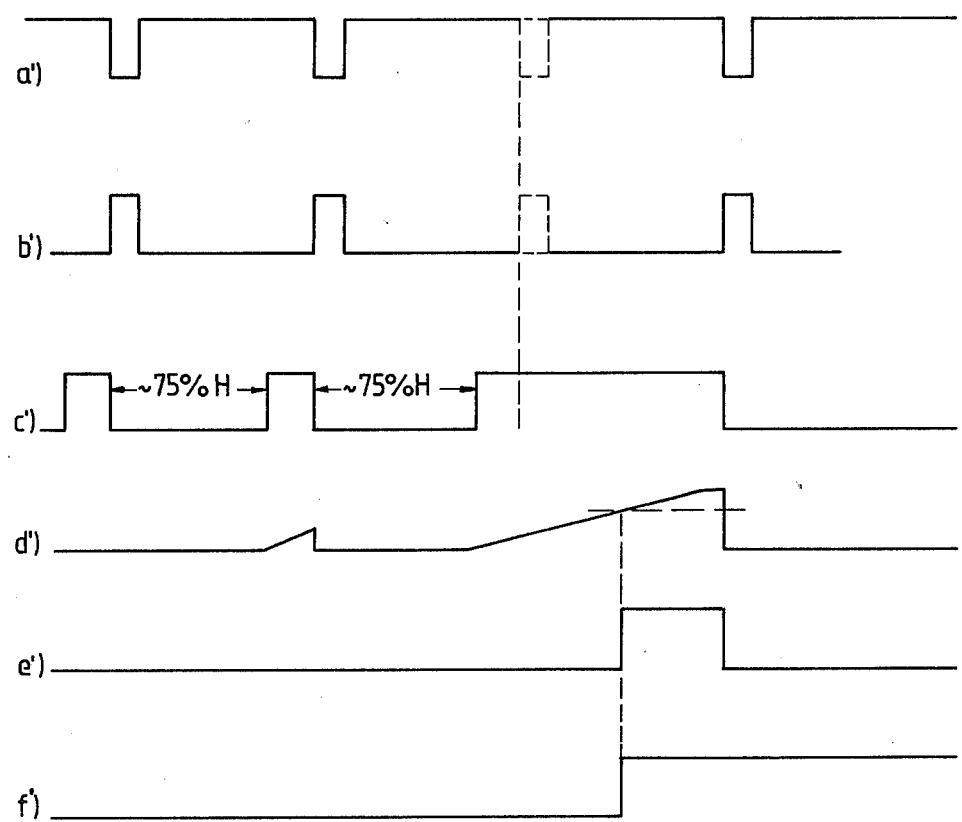

CIRCUIT FOR DETECTING FAULTS IN HORIZONTAL SYNC PULSE SIGNALS

The present invention relates to circuitry for fault detection in pulse signals, and, more particularly, in the synchronization signals of a video signal.

BACKGROUND AND PRIOR ART

The transmission and processing of pulse signals may be impaired by spurious signals and noise, resulting in errors in the evaluation of the signals. If, e.g., a video signal is transmitted over a long distance and, in particular, over an optical waveguide link, a strongly damped signal may be heavily affected by noise and spurious signals. If, in addition to synchronizing pulses, the video signal includes pulse shaped signals such as, e.g., digital information in the V-gap, spurious pulses may result in erroneous information. Such additional digital information may be inserted by means of a data transmitter and may serve, e.g., for the control of various functions of a video camera. Such information is retrieved by means of a suitable data receiver and supplied to appropriate terminals for evaluation. Misinformation caused by spurious signals and by noise is preferably eliminated at the data receiver.

THE INVENTION

It is an object of the invention to provide a circuit for fault detection which, upon detection of a fault, produces a switching signal which may be used, e.g., to block a data receiver. The invention is particularly applicable to the detection of faults in video synchronization signals.

A fault detection circuit in accordance with the invention includes a counter whose clock input terminal receives an input signal and whose control input terminal is supplied with reference signals having the same pulse frequency as the input signal, but having a different, typically smaller, keying ratio (duty cycle; pulse width to pulse period ratio). Such reference signal may be conveniently produced from the input signals by means of a monostable flip-flop.

The output terminal of the counter is connected to its release input terminal and, via a monostable flip-flop, to an input terminal or an OR-gate. The other input terminal of the OR-gate receives the reference signals via a diode and an RC-link; the desired switching voltage is produced at the output of the OR-gate.

A circuit in accordance with the invention may further include a bistable flip-flop which receives the switching signal from the OR-gate and which also receives vertically-synchronizing pulse signals.

THE DRAWING

An embodiment of the invention is shown in the Drawing and further described below.

Figure 2:
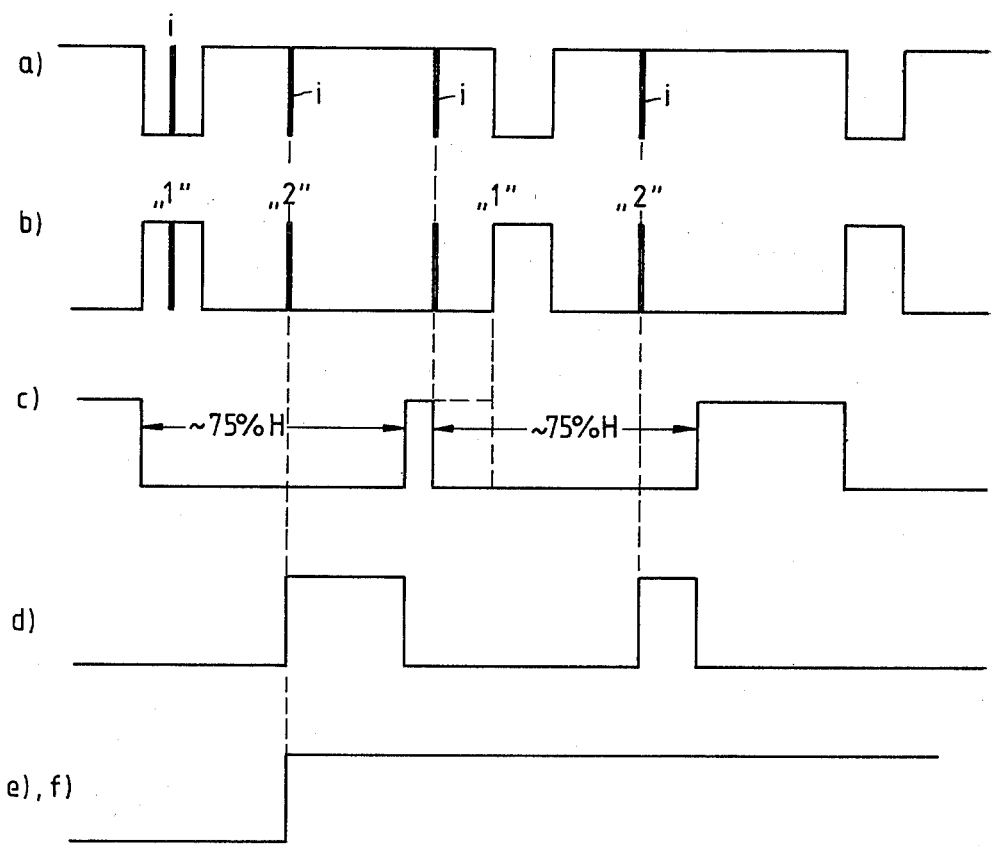

FIG. 1 shows a circuit in accordance with the invention, and FIGS. 2 and 3 are diagrams of pulses produced in a circuit in accordance with the invention.

In the circuit for fault detection of FIG. 1, a video synchronizing signal S is supplied for fault detection at the input terminal 1. The terminal 1 is connected via an inverter 2 to the clock input terminal C of a counter 3 as well as to the clock input of a monostable flip-flop 4. The output terminal of flip-flop 4 is connected to the control input R of the counter 3, to the "clear" input of the flip-flop 4 and also, via a diode 6, to an RC-link 7, 8 for further a connection described below. The counter 3 has provisions for decoded output terminals and in this case has an output terminal for the counter content "2". This output is connected to the "clear" input CE of counter 3 and to the clock input of an additional monostable flip-flop 9 whose "clear" input is connected to the positive terminal of the operating voltage. The output of the flip-flop 9 is connected to one input of an OR-gate 11 whose other input is attached to the connection 10 of the resistor 7 and the capacitor 8.

The output of the OR-gate 11 is connected to the set input S of a bistable flip-flop 12 whose clock input receives, at the terminal 13, the vertically-synchronizing pulse train V. A switching pulse voltage Sch is available at the output terminal 14 of the flip-flop 12 whenever there is a fault in the pulse signal which is applied to the terminal 1.

The operation of the circuit in accordance with the invention is conveniently described in further detail by reference to the pulse diagrams shown in FIGS. 2 and 3.

The video synchronizing signal S which is applied to the terminal 1 includes horizontally-synchronizing pulses on which spurious pulses i may be superimposed as shown in line A of FIG. 2 or, as illustrated in line A of FIG. 3, which may be faulty due to a missing horizontal synchronization pulse. Upon inversion of this signal by inverter 2, the clock input C of the counter 3 receives a signal as illustrated by line B of FIG. 2 and the clock input of the monostable flip-flop 4 receives a signal as illustrated in line B' FIG. 3.

The leading edge of the pulses (i.e., a positive voltage jump) triggers the monostable flip-flop 4 which has a pulse duration of approximately 75 percent of a horizontal synchronization pulse period. This results in output signals according to line C of FIG. 2 and line C' of FIG. 3, respectively. The signal according to line C of FIG. 2 is supplied to the control input R of the counter 3 which during this time is ready to receive the signal supplied to clock input C. Starting at a count of zero, the counter counts all positive slopes until, at a count of "2" (i.e., at the second spurious pulse, "2" in line B of FIG. 2), a positive pulse edge is produced at the output terminal "2" of the counter 3 (see line D of FIG. 2). This signal is supplied to the "clear" input CE and blocks the clock input. Simultaneously, the signal according to line D of FIG. 2 is supplied to the clock input of the monostable flip-flop 9 which has a time constant which is greater than or equal to 1.2 times the vertically-controlling pulse period. At the output of this flip-flop 9, a signal is produced as shown in line E FIG. 2. This signal is supplied via an OR-gate 11 to the set input S of the bistable flip-flop 12. At the output 14 of the flip-flop 12 the switching voltage Sch is available as shown in line F of FIG. 2, such voltage being synchronized by the vertical synchronization pulse train which is supplied at the clock pulse input. This causes the switching voltage to be vertically synchronized (provided the synchronizing signal is free of further spurious signals) so that this switching off does not disturb the appearance of a picture.

An additional possibility for the detection of faults is provided by the RC-link 7, 8 which is supplied via the diode 6 with the signal shown in line C' of FIG. 3. In the presence of a horizontal synchronization pulse the capacitor 8 is charged little during the negative excursion. In the absence of a horizontal synchronization pulse, the monostable flip-flop 4 is not set and a positive pulse having longer duration is produced at the output. During this time the capacitor 8 is charged to a higher positive voltage because the diode 6 is blocked by the positive pulse. Once a certain adjustable level is reached, a pulse signal according to line E' of FIG. 3 is produced and supplied, via one input of the OR-gate 11, to the set input of the bistable flip-flop 12. A signal according to line F' of FIG. 3 is available at the output 14 of flip-flop 12, synchronized by the vertical synchronization pulse train.

Accordingly, a switching voltage is producec at the output 14 of the flip-flop 12 whenever a fault (spurious pulse, noise, or missing synchronization pulse) is detected in the synchronizing signal. And, upon disappearance of the fault, this voltage is turned off by the vertical synchronization signal.

Example

For an expected pulse frequency of 15,750 pulses per second, the following circuit component are appropriately chosen: A resistor 7 of 47 k$\Omega$ and a capacitor 8 of 1 nF.

I claim:

1. Electrical circuit for detecting faults in a first sequence of pulse signals having a first keying ratio, said circuit including
   a counter (e) which has a clock input terminal (C) for applying pulse signals of said first sequence, a control input terminal (R) for applying a second sequence of pulse signals having the same pulse frequency as said first sequence and having a second keying ratio which is different from said first keying ratio, an output terminal corresponding to a predetermined count state and a clear terminal (CE) which is connected to said output terminal,
   a monostable flip-flop (9),
   an OR-gate (11) having a first OR input terminal, a second OR input terminal, and an OR output terminal, for producing a switching signal upon detection of a fault in said first pulse signals, the output terminal of said counter being connected by means of said flip-flop (9) to said first OR input terminal,
   an RC-link (7, 8), and
   a diode (6) for supplying to said RC-link (7, 8) said second sequence of pulse signals, said RC-link (7, 8) being connected to said second OR input terminal.

2. Circuit of claim 1 including a bistable flip-flop (12) having a set input terminal (S) which is connected to said OR output terminal, having a clock input terminal (13), and having an output terminal (14) whereby, upon application of vertical synchronization pulse signals to said clock input terminal (13), a switching pulse voltage is produced at said output terminal (14) when a fault occurs in said first sequence of pulse signals.

3. Circuit of claim 1 including a monostable flip-flop (4) for producing said second sequence of pulse signals from said first sequence of pulse signals.

4. Circuit of claim 3 in which the time constant of said monostable flip-flop (4) is 75 percent of the pulse period of horizontal synchronization pulse signals in said first sequence of pulse signals.

5. Circuit of claim 1 in which said predetermined count state of said counter is the count state 2.

6. Circuit of claim 1 in which the time constant of said monostable flip-flop (9) is greater than or equal to 1.2 times the pulse period of vertical synchronization pulse signals in said first sequence of pulse signals.

* * * * *